CLIPPING CIRCUIT UTILIZING AN INSULATED-GATE FIELD-EFFECT TRANSISTOR

Filed Feb. 12, 1964 2 Sheets-Sheet 1

INVENTOR.
LUCIUS P. THOMAS
BY
Eugene M. Whitacre
Attorney

INVENTOR.
LUCIUS P. THOMAS
BY
Eugene M. Whitacre
Attorney

United States Patent Office 3,374,312

Patented Mar. 19, 1968

3,374,312

CLIPPING CIRCUIT UTILIZING AN INSULATED-GATE FIELD-EFFECT TRANSISTOR

Lucius P. Thomas, Indianapolis, Ind., assignor to Radio Corporation of America, a corporation of Delaware Filed Feb. 12, 1964, Ser. No. 344,272
18 Claims. (Cl. 178—7.3)

ABSTRACT OF THE DISCLOSURE

A clipping circuit including an insulated-gate field-effect transistor biased so as to be rendered conductive only upon applied signals exceeding a predetermined voltage level. In a synchronizing signal separator arrangement for use in a television receiver environment, independent control of the aforementioned predetermined voltage enables design for optimum noise immunity and signal response.

The invention relates to electrical circuits employing semiconductor devices and more particularly to clipping circuits employing insulated-gate field-effect semiconductor devices.

A problem encountered in clipping circuits such as wave shaping circuits, noise inverter circuits, or synchronizing signal separator circuits, for example, which employ vacuum tubes or bipolar transistors as the active device of the circuit and which include resistive-capacitive networks, is the distortion of the output wave or signal caused by the presence of impulse noise in the input signal or by rapid changes in signal level.

Impulse noise present in the input signal or a sudden change in the level of the input signal changes the charge of the coupling capacitor through which the input signal is coupled. The coupling capacitor is charged to a higher or lower peak value than the desired charge value so that the clipping level of the circuit is changed, whereby a subsequent cycle of the input signal or a subsequent pulse of the input wave is clipped at a level different from the desired level. In many cases, the clipping level is so changed that subsequent cycles of the input signal or subsequent pulses of the input wave are not passed through the clipping circuit.

This problem is often encountered in synchronizing separator circuits employed in television receivers, for example, and the loss of some of the synchronizing pulses due to the noise present in the television picture signal is known as setting-up on noise.

Accordingly, it is an object of this invention to provide an improved clipping circuit.

It is another object of this invention to provide an improved semiconductor clipping circuit.

It is still another object of this invention to provide an improved clipping circuit having substantial immunity from setting up on noise or on rapid changes in signal level.

It is a further object of this invention to provide an improved synchronizing signal separator circiut for television receivers.

A clipping circuit in accordance with the invention includes an insulated-gate field-effect transistor having gate, source and drain electrodes. An input signal to be clipped is applied between the gate and source electrodes. A control voltage is applied between the source and gate electrodes to bias the transistor in such a manner that the transistor is rendered conductive only when the applied input signal exceeds a predetermined level. Circuit means are coupled to the drain electrode for deriving an output signal which corresponds to the portion of the input signal that exceeds the predetermined signal level.

A synchronizing signal separator circuit embodying the invention comprises a clipping circuit as described above in which the input signal applied to the field-effect transistor is a composite video signal including horizontal and vertical synchronizing pulses. The control voltage applied between the source and gate electrodes is a function of the peak signal amplitude and it is derived from control voltage circuit means adapted to receive the input signal. The composite video signal is applied to the gate electrode of the transistor and to the control voltage circuit means separately. Circuit means couple the control voltage to the gate elecrode of the transistor so that an output signal is derived between the drain and source electrodes comprising the horizontal and vertical synchronizing pulses only. Because the control voltage is derived from a circuit independent of the field-effect transistor, i.e., the control voltage circuit is independent of the gate electrode circuit of the transistor, the control voltage circuit means can be designed for optimum noise immunity independently from the consideration of good vertical synchronizing pulse response.

The novel features which are considered characteristic of the invention are set forth with particularity in the appended claims. The invention itself, however, both to its organization and method of operation as well as additional objects and advantages thereof will best be understood from the accompanying drawing in which:

Figure 1:
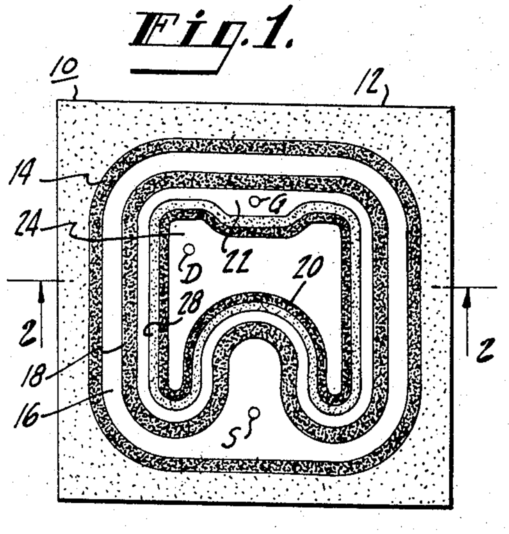
FIGURE 1 is a diagrammatic plan view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any suitable material used in the semiconductor art. For example, the body 12 may be nearly intrinsic silicon, such as for example lightly doped P-type silicon of 100 ohm. cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
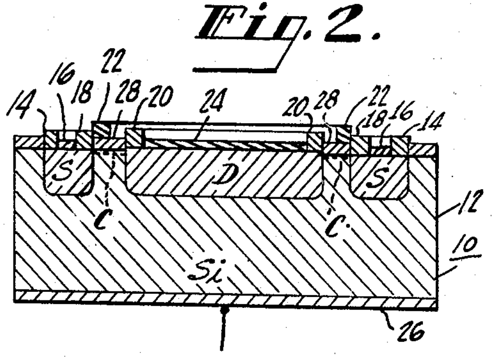
FIGURE 2 is a cross sectional view taken along section line 2—2 of FIGURE 1.

The body 12 is then heated in a suitable atmosphere such as in water vapor so that exposed silicon areas are oxidized to form grown silicon dioxide layers indicated by the stippled areas of FIGURE 1. During the heating process, impurities from the deposited silicon dioxide layer diffuse into silicon body 12 to form the source and drain regions. FIGURE 2, which is a cross section view taken along section line 2—2 of FIGURE 1, shows the source-drain regions labelled S and D respectively.

By means of another photo-resist and acid etching or like step the deposited silicon dioxide over part of the source-drain diffused regions are removed. Electrodes are formed for the source, drain and gate regions by evaporation of a conductive material by means of an evaporation mask. The conductive material evaporated may be chromium and gold in the order named, for example, but other suitable conductive materials may be used.

The finished wafer is shown in FIGURE 1, in which the stippled area between the outside boundary and the first dark zone 14 is grown silicon dioxide. The white area 16 is the conductive electrode corresponding to the source electrode. Dark zones 14 and 18 are deposited silicon dioxide zones overlying portions of the diffused source region and the dark zone 20 is a deposited silicon dioxide zone overlying a portion of the diffused drain region. White areas 22 and 24 are the conductive electrodes which correspond to the gate and drain electrodes respectively. The stippled zone 28 is a layer of grown silicon dioxide, on a portion of which the gate electrode 22 is placed, and which insulates the gate electrode 22 from the substrate silicon body 12 and from the source and drain electrodes as shown in FIGURE 2. The input resistance of the device at low frequencies is of the order of $10^{14}$ ohms. The silicon wafer is mounted on a conductive base or header 26 as shown in FIGURE 2. The layer of grown silicon dioxide 28 on which the gate electrode 22 is mounted, overlies an inversion layer of channel connecting the source and drain regions. The gate electrode 22 is displaced towards the source region S so that the distance between the source region S and the gate electrode 22 is smaller than the distance between the gate electrode 22 and the drain region D. If desired, the gate electrode may overlap the deposited silicon dioxide layer 18. Alternatively, the gate electrode may be symmetrically disposed between the source and drain regions.

The drain and source electrodes are connected to each other by a channel C. The electrons flow from source to drain in this thin channel region close to the surface. The conductive channel C is shown in FIGURE 2 in dotted lines.

The semiconductor wafer 12 may be of an opposite conductivity type to that described above and comprise a lightly doped N-type semiconductor material, with source and drain regions of P-type material. The source electrode is defined as the electrode from which majority carriers flow, and the drain electrode as that electrode to which majority carriers flow. In the case of the device of FIGURES 1 and 2 with a P-type wafer and N-type source and drain regions the majority carriers are electrons which flow toward the terminal of positive potential. Accordingly, since the device is substantially symmetrical, the one of the electrodes 16 and 24 to which the positive potential of a supply source is applied operates as the drain electrode. If the device has an N-type substrate or wafer, the majority carriers are holes, and the electrode to which the negative terminal of a supply source is applied operates as the drain electrode.

Figure 3:
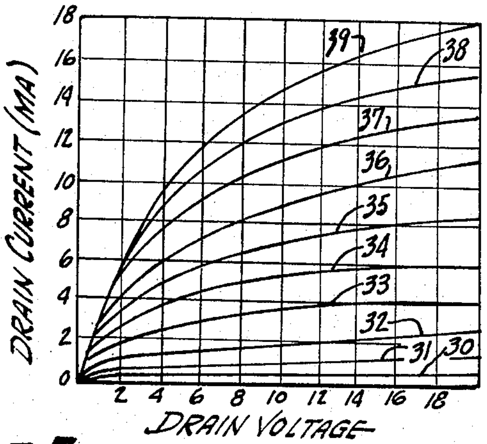
FIGURE 3 is a graph showing a family of drain current versus drain voltage curves, for various values for gate-to-source voltages for the transistor of FIGURE 1.

FIGURE 3 is a family of curves 30–39 illustrating the drain current versus drain voltage characteristic of the transistor of FIGURES 1 and 2 for different values of gate-to-source voltage. It will be noted that the curves 38–39, representative of high drain current, and the curves 30–33, representative of relatively low drain current, are relatively closely spaced, whereas the intermediate curves 35–38 are relatively uniformly spaced. The equal spacing of the curves for equal gate-to-source increments of voltage is indicative of a linear operating region for the transistor. A feature of an insulated-gate field-effect transistor is that the zero bias characteristic can be at any one of the curves 30–39 shown in FIGURE 3 with the curves above the zero bias curve representing positive gate voltages relative to the source, and the curves below the zero bias point representing negative gate voltages relative to the source.

The location of the zero bias curve can be selected by control of the processing of the transistor during its manufacture. For example, by controlling the time and/or temperature of the step of the process when the silicon dioxide layer 28 is grown, the number of free charge carriers in the device can be controlled. The longer the transistor is baked, and the higher the temperature, in a dry oxygen atmosphere, the more the drain current for a given amount of drain voltage for zero bias between the source and gate electrodes. By way of example, to establish the curve 36 as the zero bias curve, during the step which produces the silicon dioxide layer 28, the transistor was baked for two hours at 900° centigrade in an atmosphere of dry oxygen. If the temperature, or time of baking, or both are increased, the zero bias curve will correspond to one of the curves 37–39. By decreasing the temperature of time, or both, in the baking cycle the zero bias curve will occur for lower values of drain current such as for example one of the curves 30–35.

Figure 4:
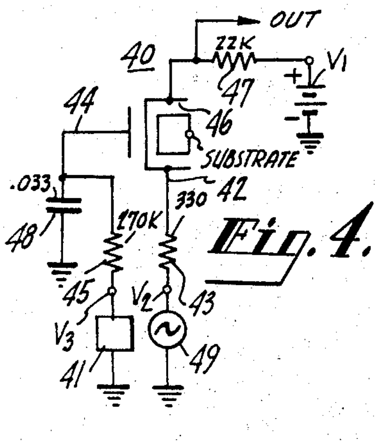
FIGURE 4 is a schematic circuit diagram of a clipping circuit embodying the invention.

Reference is now made to FIGURE 4 of the drawings which is a schematic circuit diagram of a clipping circuit embodying the invention. A transistor 40, which is similar to the transistor shown in FIGURES 1 and 2, is connected as the active device of the clipping circuit. An input signal $V_2$, which may be a sinusoidal signal, a pulse wave, or a tude of the input signal $V_2$, is coupled to the gate electrode 42 through a resistor 43 from a signal source 49 having a terminal connected to a point of fixed reference potential shown as ground. The resistor 43 is employed to prevent undesired loading of the signal source 49. A control voltage $V_3$, which may be a fixed bias voltage or which may vary in magnitude as a function of the amplitude of the input signal $V_2$, is coupled to the gate electrode 44 through a resistor 45 from a control voltage source 41 connected between the resistor 45 and ground. Signal frequencies are by-passed to a point of reference potential, shown as ground, through a capacitor 48. Output signals are developed across a resistor 47 which is connected between the drain electrode 46 and a source of operating potential shown as a battery $V_1$ for example, having its negative terminal connected to ground.

The value of the voltage $V_3$ is selected to control the flow of current through the source-drain current path, so that current flows only when the input signal applied to the source electrode 42 reaches a selected negative signal level. The output signal then corresponds to that portion of the input signal which is more negative than the selected signal level.

Figure 5:
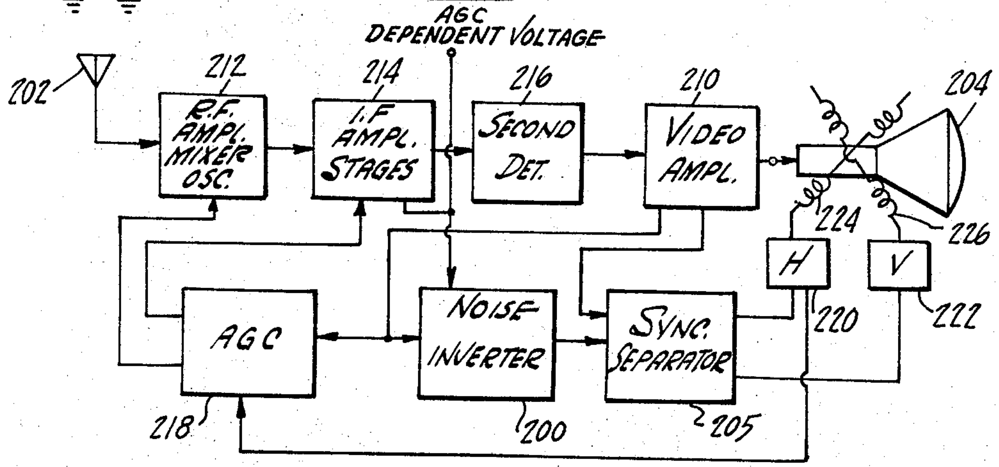
FIGURE 5 is a circuit block diagram of a television receiver.

The clipping circuit shown in FIGURE 4 may be employed, for example, as a noise cancellation circuit in a television signal receiver, similar to the television receiver illustrated in a block diagram in FIGURE 5 in which the sound channel is omitted. The noise cancellation circuit may be, for example, the noise inverter circuit 200 illustrated in FIGURE 5.

The input signal to the noise inverter circuit 200 comprises a video signal derived from the video amplifier 210, that includes horizontal and vertical synchronizing (sync) pulses. The video signal fed to the noise inverter circuit shown in FIGURE 4, the sync pulse excursions separator 205. Where the noise inverter comprises the circuit shown in FIGURE 4, the sync pulse excursions of the video signal fed thereto are in the negative direction. The video amplifier 210 then serves as the source 49, shown in FIGURE 4. The input signal to the noise inverter circuit may also be obtained from any suitable point in the receiver circuit, as is known.

The composite video signal from the video amplifier 210 is derived from a signal received by the antenna 202 and may be processed as is known in the art through an amplitude-modulated superheterodyne receiver comprising a radio frequency amplifier-mixer-oscillator stage 212, intermediate frequency amplifier stages 214 and a second detector circuit 216. The composite video signal derived from the video amplifier 210 is coupled to the picture tube 204 and to a keyed automatic-gain control (AGC) circuit 218. A control voltage is derived from the AGC circuit 218. This control voltage is a function of the change in either the blanking level or the tips of the synchronizing pulses. The AGC control voltage is applied to the radio frequency (R.F.) and intermediate frequency (I.F.) amplifier stages 212 and 214, as shown in FIGURE 5, to control the gain of the R.F. and I.F. stages. A voltage which is a function of AGC, is derived from the I.F. amplifier stages, or any other suitable source, and is applied to the noise cancellation circuit 200. This AGC dependent voltage corresponds to the control voltage $V_3$ shown in FIGURE 4. Current flows through the source-drain current path of the transistor 40 only when the input signal exceeds the level of the sync pulses, whereby only the random noise appearing in the video signal causes the transistor 40 to conduct.

The noise output signal derived from the drain electrode 46 of the clipping circuit shown in FIGURE 4 may be utilized to cancel a substantial portion of the noise present in the composite video signal in a television receiver. This may be done, for example, by applying the noise output signal to a synchronizing signal separator circuit 205 as shown in FIGURE 5. The noise signal derived from the noise inverter circuit 200 comprises the portion of the noise present in the composite video signal that exceeds the sync pulse level. This noise signal from the inverter 200 is 180° out of phase with the noise in the composite video signal applied to the sync separator circuit 205 from the video amplifier 210 to provide cancellation.

Because the gate-to-source impedance of the transistor 40 is very high, the signal applied to the gate does not produce a direct current (D-C) gate current flow. Accordingly, the charge on the capacitor 48 and hence the operating point of the transistor 40 is substantially immune to set-up on noise or rapid changes in signal level which would cause subsequent pulses or subsequent portions of the input signal to appear distorted at the output and in some cases completely disappear.

Figure 6:
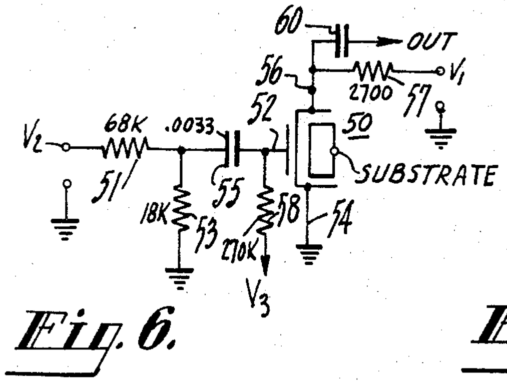
FIGURE 6 is a schematic circuit diagram of another clipping circuit embodying the invention.

Reference in now made to FIGURE 6 of the drawings, which is a schematic circuit diagram of another clipping circuit embodying the invention. A transistor 50 which is similar to the transistor shown in FIGURES 1 and 2 is connected as the active device of the clipping circuit. An operating potential $V_1$, from a source of operating potential (not shown) and which may be a battery having its negative terminal grounded for example, is applied through a resistor 57 between the source electrode 54 and the drain electrode 56. The source electrode 54 is connected to a point of reference potential shown as ground.

Input signals $V_2$, which may be a video signal for example, are coupled to the gate electrode 52 through a resistor 51 and a capacitor 55. A resistor 53 connected between ground and the resistor 51 forms with the resistor 51 a voltage divider network to obtain the desired level of input signal.

A control voltage $V_3$, which controls the threshold of conduction between the drain and source electrodes, as explained in connection with FIGURE 4, is applied to the gate electrode 52 through a resistor 58. The control voltage $V_3$ is of such a magnitude that the transistor 50 is normally in its cut-off condition and current flows through the source-drain current path of the transistor 50 only when the signal voltage $V_2$ exceeds the level set by the control voltage $V_3$.

Output signals are derived from the transistor 50 through a coupling capacitor 60 connected between the drain electrode 56 and a utilization circuit (not shown). The clipping circuit shown in FIGURE 6 may comprise the noise cancellation or noise inverter circuit 200 employed in a television receiver, as shown in FIGURE 5, for example. In this case, the video signals applied to the gate electrode 52 are in the same phase as the video signals applied to the sync separator 205, and the sync pulses extend in the positive direction. The control voltage $V_3$ may be derived as a function of the AGC circuit of the television receiver as shown in FIGURE 5 or, if desired for other applications, a fixed bias voltage may be applied between the gate and source electrodes 52 and 54. In the case where the clipping circuit is employed as a noise inverter circuit in a television signal receiver, conduction in the source-drain current path of the transistor occurs only when the noise exceeds the level of the sync peaks.

The noise signal derived from the drain electrode 56 is inverted in phase and has an amplitude determined by the gain of the transistor. Because the transistor 50 does not permit current flow through the gate electrode, the charge on the capacitor 55, which determines transistor bias, does not setup on noise peaks. Accordingly, the problems attendant with the compromise between the input circuit time constant and optimum clipping performance and good noise immunity are materially reduced.

Figure 7:
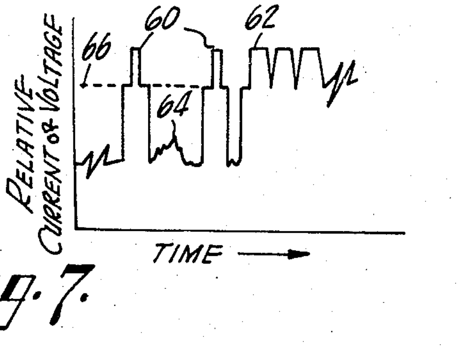
FIGURE 7 is a graph showing a portion of a video signal helpful in describing the operation of the circuit shown in FIGURE 6.
Figures 8, 9, 10:
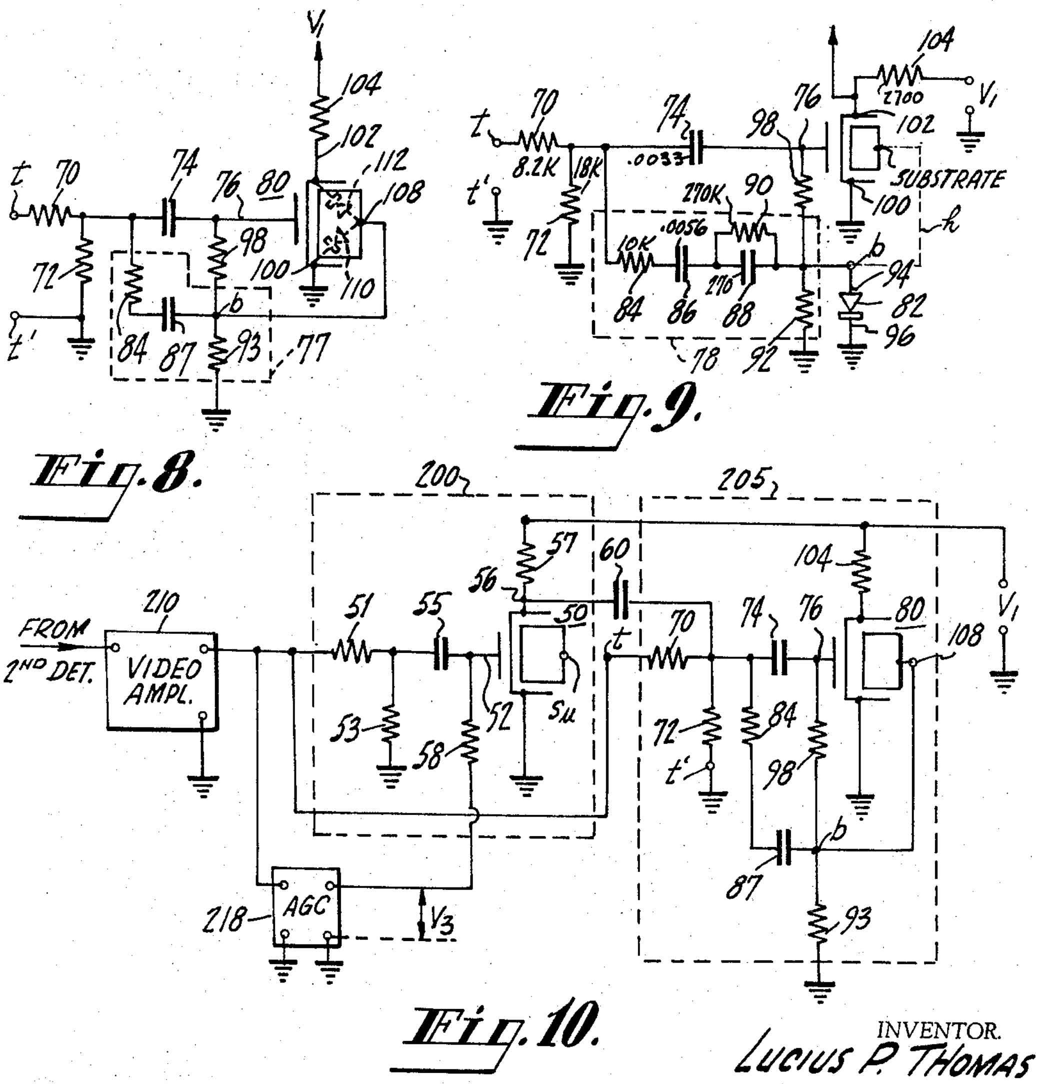
FIGURE 8 is a schematic circuit diagram of a synchronizing signal separator circuit for television receivers embodying the invention.
FIGURE 9 is a schematic circuit diagram of another synchronizing signal separator circuit embodying the invention.
FIGURE 10 is a schematic circuit diagram, partly in block form, of a noise inverter circuit-synchronizing signal separator circuit combination employed in a television receiver embodying the invention.

Reference is now made to FIGURES 7 and 8 of the drawings. FIGURE 8 is a schematic circuit diagram of a clipping circuit which may be employed as a synchronizing signal separator (sync separator) circuit in a television receiver, as shown in FIGURE 5 for example, and FIGURE 7 is a graph showing a composite video signal useful in explaining the circuit of FIGURE 8.

A composite television signal, which is modulated upon the picture carrier wave, comprises a train of relatively narrow horizontal synchronizing pulses 60 recurring at the end of each scanning line and a train of relatively wide vertical synchronizing pulses 62 recurring at the end of each complete picture field. These pulses all have the same amplitude with respect to a reference voltage level corresponding to the blanking level 66 and this amplitude is greater than the maximum amplitude of any of the interspersed picture signal components 64.

The horizontal synchronizing pulses 60 recur at the relatively high frequency of approximately 15,750 per second and the vertical synchronizing pulses recur at the relatively low frequency of approximately 60 per second. The vertical synchronizing pulses 62 are shown slotted at twice the line-scanning rate of FIGURE 7 and the equalizing pulses which are ordinarily inserted preceding the vertical synchronizing pulses are omitted in FIGURE 7.

The principal function of a sync separator circuit in a television receiver is to separate the vertical and horizontal synchronizing pulses from the remainder of the picture signal.

A video signal similar to that described in connection with FIGURE 7 is applied between the input terminals *t* and *t'* of the input circuit of the sync separator circuit shown in FIGURE 8. A voltage divider network including resistors 70 and 72 is used to obtain the desired input signal level, and to prevent capacitive loading of the preceding video amplifier by the sync separator circuit. The signal voltage developed across the resistor 72, which is connected to a point of reference potential (shown as ground), is coupled through a coupling capacitor 74 to the gate electrode 76 of an insulated-gate field-effect transistor 80, which is similar to the transistor shown in FIGURE 1. The transistor 80 is of the enhancement type, i.e., the zero bias characteristic curve corresponds to the curve 30 of FIGURE 3. Hence in the absence of signals substantially no drain current flows through the source-drain current path. However depletion type transistors, i.e., the zero bias curve corresponding to a curve other than curve 30, such as curve 36 for example, may also be employed as long as an appropriate biasing circuit is provided to obtain the desired operation, i.e., substantially no drain current flows except during the sync pulse intervals.

The coupling capacitor 74 together with the resistor 98 form a high pass filter network having a frequency response characteristic which passes the vertical synchronizing pulses without distortion to the gate electrode 76 of the transistor 80.

The video signal is also coupled through a network 77 to the substrate 108 of the field-effect transistor 80. As above mentioned, the source and drain regions S and D of the field-effect transistor are in rectifying contact with the substrate 108, so that effectively a pair of rectifying junctions 110 and 112 exist between the substrate 108 and the source and drain electrodes 100 and 102. The network 77 connected between resistor 70 and ground, comprises a peak current limiting resistor 84 connected in series with a coupling capacitor 87 and a discharge resistor 93. The substrate 108 is connected to the terminal *b* of the network 77 so that the rectifying junction 110 is connected across the resistor 93 whereby the rectifying junction 110 is rendered conductive for positive-going signals thereby effecting a clamp-type action. The source electrode 100 of the transistor 80 is connected to ground, and an operating potential is applied between the source and drain electrodes 100 and 102 through a resistor 104 connected between the drain electrode 102 and a source of operating potential $V_1$ (not shown).

In the operation of the circuit, the composite video signal with sync peaks aligned at a predetermined potential level is developed across the resistor 72. Ignoring the rectifying junction 110 circuit, when the composite video signal is passed through the capacitor 74, the sync peaks ordinarily would not be aligned at a given potential level at the gate 76, but would vary as a function of the picture content, as is well-known. However, the composite video signal is also capacitively coupled to the rectifying junction 110 circuit. The rectifying junction 110 aligns the sync peaks by clamping them to ground potential. Stated otherwise, the rectifying junction 110 circuit develops sufficient D-C voltage which is combined via resistor 98 with the composite video signal to align the sync peaks at some D-C reference potential.

This D-C voltage is added through the resistors 93 and 98 to the composite signal at the gate electrode 76 to align the sync peaks at a potential which drives the transistor 80 into conduction.

An important improvement in the noise immunity of the sync separator circuit is provided by the fact that the peak current limiting resistor 84 may be made larger than the peak current limiting resistor that can be tolerated in tube or bipolar transistor circuits. It should be understood that the larger the resistance value of the resistor 84, the better the noise immunity of the circuit. The improved noise immunity results because the resistor 84 attenuates high frequency noise impulses by (1) limiting the peak noise current which can flow through the rectifying junction 110 and hence produce lower noise set-up charge in the capacitor 74 and (2) providing with the shunt capacitance to ground a low pass filter which attenuates higher frequency components of noise impulses.

The reason the resistor 84 can be larger than in prior circuits is because substantially more integration of the composite video signal can be tolerated. In this regard, in prior sync separators too much integration of the composite video signal produces a rounding of the leading edge of the sync pulse thereby adversely affecting the timing of the deflection generators and causing picture jitter. However, since the resistor 84 together with the rest of the circuit 77 and the rectifying junction 110 produce only the tracking D-C bias voltage for the transistor 80, considerably more integration of the composite video signal can be tolerated up to the point where the video signal itself gets integrated and begins to produce a component in the D-C bias voltage which varies with picture content.

The maximum value of the resistor 84 is dictated primarily by the amount of D-C voltage required to be developed across the resistor 93. The resistor 84 and the rectifying junction 110 comprises a voltage divider, and the larger the resistor 84 the smaller D-C voltage developed across the resistor 93. In this regard it should be noted that the resistor 84 may be connected to the video signal source at a different point from that shown, and may be tapped up or down on the resistors 70 and 72 in accordance with the video drive needed for the network 77 and the loading on the video signal source which can be tolerated.

The circuit shown in FIGURE 8 may be modified as shown in FIGURE 9 to obtain improved noise immunity. The circuit elements that are common to both embodiments are identified by the same numerals to indicate that their value and their functions are similar.

A double time constant network 78 is substituted for the network 77 shown in FIGURE 8, and a diode 82 is connected to the network 78 at the terminal *b* in place of the rectifying junction 110. The rectifying junction 110 may be employed in the circuit shown in FIGURE 9 if desired, by connecting the semiconductor substrate to the terminal *b* as shown by the dashed line *h*, but the diode 82 in lieu thereof is shown as an alternate choice of the elements in the circuit.

A composite video signal, similar to the signal shown in FIGURE 7 is applied to the input terminals *t* and *t'* and as shown in FIGURE 8 a coupling capacitor 74 coupled the input signal to the gate electrode 76 of the transistor 80.

The video signal is also coupled through the double time constant network 78 to the semiconductor diode 82 to develop a biasing voltage for the transistor 80 which aligns the sync pulses at a reference level to permit separation thereof from the composite signal. The double time constant network 78 includes the peak current limiting resistor 84 connected in series with a relatively large coupling capacitor 86. The capaictor 86 is connected in series with the parallel combination of a relatively small capacitor 88 and a resistor 90. A resistor 92 completes the paths to a point of fixed reference potential shown as ground. The anode electrode 94 of the diode 82 is connected to the junction of the capacitor 88 and the resistor 92, and the cathode electrode 96 is connected to ground so that the diode 82 is rendered conductive for positive-going signals thereby effecting a clamp-type action.

The RC time constant provided by the capacitor 86 and the resistors 84, 90 and 92 is long enough to permit the capacitor 86 to hold its charge without substantial loss during the interval betwen consecutive vertical synchronizing pulses. The RC time constant provided by the capacitor 88 and the resistor 90 should be short enough to permit the capacitor 88 to discharge to a substantial extent during the period between consecutive vertical synchronizing pulses. That is, it should not be less than the time period of one scanning line, nor more than the duration of a few horizontal scanning lines.

The anode electrode 94 is connected to the gate electrode 76 through a large resistor 98 to apply the bias voltage developed as a result of the diode 82 action to bias the transistor 80.

Output signals (clipped horizontal and vertical synchronizing pulses) are derived from the drain electrode 102 across a resistor 104 connected between the drain electrode 102 and a source of operating potential $V_1$, not shown, and which may be a battery having its negative terminal grounded, for example. The signal derived from the sync separator circuit is processed through suitable means to separate the vertical and horizontal synchronizing pulses from each other and then they are separately coupled to desired utilization circuits which may be for example, the horizontal and vertical scanning wave generators of a television receiver (well-known in the art) as shown by the scanning wave generators 220 and 222 of the television receiver shown in FIGURE 5. Also, as shown in FIGURE 5, the output signals from the horizontal and vertical scanning wave generators 220 and 222 are respectively applied to the deflection coils 224 and 226.

In operation, assuming that the composite television picture signal is applied to the input terminals $t$ and $t'$ at the beginning of a picture field, the diode 82 draws current through the capacitors 86 and 88 during each horizontal synchronizing pulse. The capacitor 88 is rapidly charged during the first horizontal pulse to a certain voltage. Because approximately the same current flows through both capacitors for the short duration of a horizontal synchronizing pulse, the ratio of the voltages across the capacitors 86 and 88 is approximately equal to the inverse ratio of their capacity values, and because the capacitance of the capacitor 88 is much smaller than the value of the capacitance of the capacitor 86, most of the voltage appears across the capacitor 88.

The capacitor 88 discharges rapidly through the resistor 90 during the interval preceding the subsequent horizontal synchronizing pulse, but the voltage in the capacitor 86 remains substantially constant because of its relatively large associated time constant (capacitor 86, resistor 92).

The capacitor 86 is eventually charged substantially to the positive peak amplitude of the composite television signal. The voltage across the capacitor 88, however, eventually decreases to a relatively low value sufficient to equal the loss in voltage on the capacitor 86 between consecutive horizontal synchronizing pulses.

The voltage detected by the diode 82 controls the conduction of the transistor 80 so that transistor 82 is rendered conductive only by the horizontal and vertical synchronizing pulses thereby aligning the tips of the synchronizing pulses at the gate electrode 76.

Noise impulses present in the signal received at the terminal $t$ and $t'$ are detected by the diode 82, but the short time constant provided by the capacitor 88 and the resistor 90 reduces the susceptibility of the transistor 80 from being set-up on noise so that there is minimum loss in the synchronizing pulse separation.

The presence of noise impulses in the gate electrode circuit, however, does not create the problem of setting up the sync separator circuit on noise because there is no gate current to charge the coupling capacitor 74. This permits the independent consideration of the transistor's gate time constant for optimum sync separation, and the diode's time constant for optimum noise immunity.

As previously explained, circuits embodying the invention advantageously permit independent circuits for feeding the composite signal to the sync separator and to the control voltage developing circuit. As a result considerably more integration can be tolerated in the control voltage developing circuit, and the current limiting resistor 84 has a value that is larger than similar peak current limiting resistors in sync separator circuits employing bipolar transistors or vacuum tubes. In the prior sync separator circuits where the grid or base diode is used to develop the control voltage, less series current limiting resistance can be tolerated because of the resultant integration which produces a rounding of the edge of the sync pulse.

Representative values of the elements of the circuits shown in FIGURES 4, 6 and 9 are indicated in the drawings as an illustration. The values of the resistors are given in ohms except where the value of the resistor is in thousands of ohms in which the case the letter K is added to signify one thousand times the value given. The value of the capacitors are given in microfarads with the exception of capacitor 88 shown in FIGURE 9 which has a value of 270 micromicrofarads.

Reference is now made to FIGURE 10 of the drawings in which a noise inverter circuit and a synchronizing signal separator circuit embodying the invention are shown in combination to exemplify their utilization in a television receiver. The same numerals identify the elements of the circuits (or the blocks representing circuits) common to the different embodiments of the invention shown in the drawings to indicate that their values and functions are similar.

A composite video signal from a video amplifier 210, shown in FIGURE 5, is coupled to a noise inverter circuit 200 similar to the one shown in FIGURE 6 of the drawings. An output signal from the noise inverter circuit 200 is derived across the resistor 57 and coupled through a coupling capacitor 60 to the gate circuit of the field-effect transistor 80. The field-effect transistor 80 is employed as the active device of a synchronizing signal separator circuit 205 similar to the one shown in FIGURE 8, and which is shown as part of a television receiver in FIGURE 5. The composite video signal derived from the video amplifier 210 is also connected to the gate circuit of the transistor 80 between the input terminals $t$ and $t'$.

The signal from the noise inverter circuit 200 comprises the portion of noise impulse present in the composite video signal derived from the video amplifier 210, that exceeds the signal level determined by an AGC control voltage $V_3$ and which is applied to the gate electrode 52 of the transistor 50 (as explained in connection with FIGURE 6). The noise signal derived from the drain electrode 56 has an amplitude determined by the gain of the transistor 50, and this noise signal is 180° out of phase with the noise in the composite video signal derived from the video amplifier 210.

This noise signal which is applied to the junction of the voltage divider network comprising resistors 70 and 72 substantially cancels the noise present in the composite video signal applied to the gate electrode 76 of the transistor 80 so that improved noise immunity is provided for the sync separator circuit 205.

The operation of the noise inverter circuit 200 and the sync separator circuit 205 is similar to the operation described in connection with circuits respectively shown in FIGURES 6 and 8 of the drawings.

What is claimed is:

1. A clipping circuit including an insulated-gate field-effect transistor having gate, source and drain electrodes,
- an input circuit for applying input signals between said gate and source electrodes,
- means for biasing said gate electrode with respect to said source electrode so that current flows through the source-drain current path only when said input signal exceeds a predetermined level, and
- load impedance means coupled between said drain and source electrodes for developing a signal which corresponds to a portion of the input signal exceeding said predetermined level.

2. A noise cancellation circuit including an insulated-gate field-effect transistor having gate, source and drain electrodes,
- means coupled between said gate and source electrodes for applying a video signal to said noise cancellation circuit, said video signal including horizontal and vertical synchronizing pulses having a predetermined amplitude,
- means for biasing said gate electrode with respect to said source electrode so that current flows through the source-drain current path only when the noise associated with said video signal exceeds the amplitude of said synchronizing pulses, and
- load impedance means coupled between said drain and source electrodes for developing a noise signal which corresponds to the portion of the input noise exceeding the amplitude of said synchronizing pulses.

3. A clipping circuit including an insulated-gate field-effect transistor having gate, source and drain electrodes,
input circuit means for applying an input signal between said gate and source electrodes,
means for biasing said gate electrode with respect to said source electrode so that current flows through the source-drain current path only when said input signal exceeds a predetermined level, and
load impedance means coupled between said drain and source electrodes for developing an output signal having an amplitude determined by the gain of said transistor, said output signal corresponding to the portion of said input signal that exceeds said predetermined level.

4. A clipping circuit including an insulated-gate field-effect transistor having gate, source and drain electrodes,
an input circuit for applying input signals between said gate and source electrodes,
means coupled between said gate and source electrodes to bias said transistor to cut-off that current flows through said source-drain current path only when said input signal overcomes said cut-off bias, said biasing means applying a biasing voltage that is a function of the signal amplitude, and
load impedance means coupled between said drain and source electrodes for developing a signal having a substantially constant amplitude.

5. A clipping circuit including an insulated-gate field-effect transistor having gate, source and drain electrodes,
means including a coupling capacitor connected to said gate electrode for applying input signals between said gate and source electrodes,
automatic gain control circuit means for biasing said gate electrode with respect to said source electrode as a function of the amplitude of said input signal, and
load impedance means coupled between said drain and source electrodes for developing a signal which corresponds to a portion of the input signal exceeding the level determined by said automatic gain control means.

6. A signal translating circuit including an insulated-gate field-effect transistor having gate, source and drain electrodes, said gate electrode being insulated from said drain and source electrodes,
input circuit means for applying an input signal including noise between said gate and source electrodes,
automatic gain control means coupled between said gate and source electrodes to bias said transistor to cut-off so that current flows through the source-drain current path only when said noise exceeds said input signal level, and
load impedance means coupled between said drain and source electrodes for developing a noise signal which corresponds to a portion of the input signal noise exceeding said input signal level.

7. In combination,
an insulated-gate field-effect transistor having gate, source and drain electrodes,
an input circuit for applying an input signal between said gate and source electrodes,
means for applying an operating potential between said drain and source electrodes,
means for biasing said gate electrode with respect to said source electrode so that current flows through the source-drain current path only when said input signal exceeds a predetermined level, and
output circuit means adapted to be coupled to a utilization circuit for developing an output signal between said source and drain electrodes, said output signal corresponding to the portion of said input signal exceeding said predetermined level and having an amplitude which is a function of the gain of said transistor.

8. In a television signal receiver, including a sync separator circuit, a noise cancellation circuit comprising in combination,
an insulated-gate field-effect transistor having gate, source and drain electrodes,
means coupled between said gate and source electrodes for applying a composite video signal to said noise cancellation circuit, said video signal including horizontal and vertical synchronizing pulses having a predetermined amplitude, said video signal having unwanted impulse noise,
means for coupling said video signal to said sync separator circuit,
means for biasing said gate electrode with respect to said source electrode as a function of the amplitude of said composite video signal so that current flows through the source-drain current path only when said impulse noise exceeds the amplitude of said synchronizing pulses,
output circuit means connected between said drain and source electrodes for deriving a noise signal which corresponds to the portion of said impulse noise that exceeds the amplitude of said synchronizing pulses, and
circuit means coupled between said output circuit means and said sync separator circuit for applying said noise signal to said sync separator circuit so that said noise signal substantially cancels said unwanted impulse noise in said composite video signal.

9. A clipping circuit comprising in combination, an insulated-gate field-effect transistor having gate, source and drain electrodes, said gate electrode being insulated from said drain and source electrodes,
input circuit means for applying a composite video signal to said slipping circuit,
means, including a coupling capacitor, coupled between said input circuit means and said gate electrode for applying said composite video signal between said source and gate electrodes,
circuit means including a semiconductor diode coupled between said input circuit means and said source electrode for developing a bias voltage as a function of the peak amplitude of said composite video signal, said biasing circuit means including a resistor for limiting the peak current flow through said diode,
means for coupling said bias voltage between said gate and source electrodes, and
load impedance means coupled between said drain and source electrodes for developing a signal which corresponds to a portion of said composite video signal exceeding the level determined by said biasing circuit means.

10. A synchronizing signal separator circuit comprising in combination,
an insulated-gate field-effect transistor having gate, source and drain electrodes,
input circuit means for receiving a composite television picture signal including vertical and horizontal synchronizing pulses,
a first capacitor connected between said input circuit means and said gate electrode for coupling said composite television picture signal to said transistor,
biasing circuit means connected to said input circuit means including a second capacitor, a resistor and a diode to develop a bias voltage as a function of the peak amplitude of said composite television picture signal,
means for applying said bias voltage between said gate and source electrodes, and
means connected between said source and drain electrodes for deriving an output signal which includes only said vertical and horizontal synchronizing pulses.

11. In combination:

an insulated-gate field-effect transistor having gate, source and drain electrodes, an input circuit adapted to receive a composite television picture signal, coupling circuit means connected between said input circuit and said gate electrode including a first capacitor having a value of capacitance such that the synchronizing vertical pulses of said composite television picture signal are coupled to said gate electrode without distortion, bias circuit means, including a diode, coupled to said gate electrode of said transistor for biasing said transistor as a function of the peak value of said television picture signal, means coupling said input signal to said bias circuit means including a peak current limiting resistor having a value such as to provide integration of the composite video signal up to the point where said video portion of said composite video signal starts to be integrated, means coupled between said gate electrode and said diode for applying said bias voltage to said transistor, and output circuit means coupled to said drain electrode for deriving an output signal comprising solely said vertical and horizontal synchronizing pulses.

12. A synchronizing signal separator circuit comprising in combination, an insulated-gate field-effect transistor having gate, source and drain electrodes and a substrate of semiconductor material, said transistor including rectifying means intrinsically connected between said substrate and said source electrode, a voltage divider network having input, output and common terminals, means for applying a composite television picture signal including horizontal and vertical sychronizing pulses between said input and common terminals, means connected between said output terminal and said gate electrode for applying a desired portion of said television picture signal to said transistor, circuit means connected between said output-terminal and said substrate including a resistor and a capacitor for applying said composite video signal to said substrate rectifying means to develop a bias voltage as a function of the peak amplitude of said composite video signal, means for coupling said bias voltage between said gate and source electrodes, and output circuit means connected between said drain and source electrodes for deriving an output signal that comprises solely said horizontal and vertical synchronizing pulses.

13. In combination:

first and second insulated-gate field-effect transistors each having gate, source and drain electrodes and a substrate of semiconductor material, an input circuit adapted to receive a composite television picture signal, said television picture signal including horizontal and vertical synchronizing pulses, and having impulse noise present in said signal, means coupled between said input circuit and the gate electrode of said first transistor for applying said composite television picture signal to said first transistor, bias circuit means coupled to said gate electrode of said first transistor for applying a control voltage that sets a threshold voltage to determine the conduction of said first transistor, said control voltage having a value determined as a function of the peak value of said composite television picture signal, means connected between said drain and source electrodes of said first transistor for deriving a noise output signal which corresponds to the portion of said noise impulses present in said composite video signal that exceeds the threshold value set by said control voltage, said noise signal being 180° out of phase with said composite video signal and having an amplitude determined by the gain of said first transistor, circuit means including a coupling capacitor having a value of capacitance determined by the repetition rate of said vertical synchronizing pulses so that said vertical synchronizing pulses are coupled without distortion, circuit means coupled between said input circuit and said gate electrode of said second transistor for applying said composite video signal between said gate and source electrodes of said second transistor, biasing means coupled between said input circuit and said substrate of said second transistor including a peak current limiting resistor and a second capacitor for applying said composite video signal to said substrate, said substrate having rectifying circuit means intrinsically connected between said substrate and said source and drain electrodes respectively, said rectifying circuit means coupled between said substrate and said source clamping the tips of said horizontal and vertical synchronizing pulses to a fixed potential, circuit means coupled between said substrate and said gate electrode of said second transistor for applying the control voltage derived by the rectifying action of said substrate to control the source-drain current flow of said second transistor, means coupled to said first capacitor for applying said noise output signal from said first transistor so that substantial cancellation of the noise impulse present in said composite television picture signal is effected, and circuit means coupled between drain and source electrode of said second transistor for deriving an output signal which consists solely of said horizontal and vertical synchronizing pulses.

14. A synchronizing signal separator circuit comprising in combination:

an insulated-gate field-effect transistor having gate, source and drain electrodes, input circuit means having input, output and common terminals, a voltage divider network including two resistors connected in series between said input and common terminals, said output terminal being connected to the junction of said two resistors, means for applying composite video signals between said input and common terminals, said composite video signal including horizontal and vertical synchronizing pulses, a capacitor connected between said output terminal and the gate electrode of said transistor for applying a desired portion of said composite video signal to said transistor, said capacitor having a value of capacitance such that said vertical synchronizing pulses are coupled to said gate electrode without distortion, a double-time constant network to provide noise immunity coupled between said output terminal and a semi-conductor diode for deriving a bias voltage as a function of the peak amplitude of said composite video signal, said double-time network including a peak current limiting resistor connected in series with second and third capacitors connected between said input terminal and said diode, a first resistor connected across said third capacitor to provide a relatively small time constant, a second resistor connected across said diode to provide with said second capacitor a first time constant which is sufficiently large to hold the charge of said capacitor between consecutive vertical synchronizing pulses, said peak limiting resistor having a value such that it limits the current flow through said diode up to a point where the video portion of said composite video signal begins to provide a component to the voltage detected by said diode, circuit means coupling the voltage detected by said diode to said gate electrode to control the current flow through the source-drain current path of said transistor, and circuit means connected between said drain and source electrode for deriving an output signal which comprises said vertical and horizontal synchronizing pulses only.

15. An electrical circuit comprising in combination:

an insulated-gate field-effect transistor having source, gate and drain electrodes formed on a semiconductor substrate;

a signal input terminal;

first circuit means capacitively coupling said input terminal to said gate electrode;

control voltage deriving means;

second circuit means capacitively coupling said input terminal to said control voltage deriving means, said second circuit means providing more integration of signals applied to said signal input terminal than said first circuit means;

third circuit means coupling said control voltage deriving means to said gate electrode; and output circuit means coupled between said source and drain electrodes.

16. An electrical circuit as defined in claim 15 wherein said control voltage deriving means comprises the substrate to source path of said insulated-gate field-effect transistor.

17. An electrical circuit as defined in claim 15 wherein said control voltage deriving means comprises a diode coupled between said gate and source electrodes.

18. An electrical circuit comprising in combination an insulated-gate field-effect transistor having source, gate and drain electrodes formed on a semiconductor substrate;

a signal input terminal;

first circuit means capacitively coupling said input terminal to said gate electrode;

rectifying means;

second circuit means capactively coupling said input terminal to said rectifying means, said second circuit means providing more integration of signals applied to said siganl input terminal than said first circuit means;

means direct current coupling said rectifying means to said gate electrode; and output circuit means coupled between said source and drain electrodes.

References Cited

UNITED STATES PATENTS 3,290,613 12/1966 Theriault ---------- 307—88.5

ROBERT L. GRIFFIN, *Primary Examiner.*

JOHN W. CALDWELL, *Examiner.*

R. L. RICHARDSON, *Assistant Examiner.*

UNITED STATES PATENT OFFICE

CERTIFICATE OF CORRECTION

Patent No. 3,374,312 March 19, 1968

Lucius P. Thomas

It is certified that error appears in the above identified patent and that said Letters Patent are hereby corrected as shown below:

Column 4, line 37, "tude of the input signal $V_2$, is coupled to the gate" should read -- video signal, for example, is coupled to the source --; lines 70 and 71, cancel "shown in Figure 4, the sync pulse excursions separator 205." and insert -- is inverted in polarity from that fed to the sync separator 205. --. Column 14, line 70, "input" should read -- output --.

Signed and sealed this 9th day of September 1969.

(SEAL)

Attest:

Edward M. Fletcher, Jr.
Attesting Officer

WILLIAM E. SCHUYLER, JR.
Commissioner of Patents